(12) United States Patent
Andre

(10) Patent No.: US 7,697,321 B2
(45) Date of Patent: Apr. 13, 2010

(54) NON-VOLATILE MEMORY CELL AND METHODS THEREOF

(75) Inventor: Thomas W. Andre, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 518 days.

(21) Appl. No.: 11/438,541

(22) Filed: May 22, 2006

(65) Prior Publication Data

US 2007/0268741 A1    Nov. 22, 2007

(51) Int. Cl.
 *G11C 11/00* (2006.01)
(52) U.S. Cl. .................. 365/158; 365/171; 365/173
(58) Field of Classification Search ............ 365/158, 365/207, 171, 148
See application file for complete search history.

(56) References Cited

U.S. PATENT DOCUMENTS

| | | | |
|---|---|---|---|
| 6,584,011 B2 * | 6/2003 | Watanabe | 365/158 |
| 6,650,158 B2 | 11/2003 | Eliason | |
| 6,862,226 B2 | 3/2005 | Toyoda et al. | |
| 6,914,808 B2 * | 7/2005 | Inaba | 365/158 |
| 6,914,845 B2 | 7/2005 | Ooishi | |
| 6,934,178 B2 | 8/2005 | Yokozeki et al. | |
| 7,206,217 B2 * | 4/2007 | Ohtsuka et al. | 365/154 |
| 2004/0125649 A1 * | 7/2004 | Durlam et al. | 365/158 |
| 2005/0180205 A1 * | 8/2005 | Park et al. | 365/171 |
| 2006/0152972 A1 * | 7/2006 | Ooishi et al. | 365/171 |
| 2006/0227598 A1 * | 10/2006 | Sakimura et al. | 365/158 |
| 2006/0274573 A1 * | 12/2006 | Iwata | 365/158 |
| 2009/0034322 A1 * | 2/2009 | Hung et al. | 365/158 |

OTHER PUBLICATIONS

Andre, et al., "A 4-Mb 0.18-microns 1T1MTJ Toggle MRAM With Balanced Three Input Sensing Scheme and Locally Mirrored Unidirectional Write Drivers," IEEE Journal of Solid-State Circuits, vol. 40, No. 1, Jan. 2005, pp. 301-308.
U.S. Appl. No. 11/097,658, filed Apr. 1, 2005.

* cited by examiner

*Primary Examiner*—Vu A Le
*Assistant Examiner*—Han Yang
(74) *Attorney, Agent, or Firm*—Ingrassia Fisher & Lorenz, P.C.

(57) ABSTRACT

A non-volatile storage element disposed at an integrated circuit is disclosed. The storage element includes a first resistive element having a first magnetic tunnel junction (MTJ) element, a first node coupled to the first resistive element, a second resistive element having of a second MTJ element, a second node coupled to the second resistive element, a sense amplifier having a first input coupled to the first node, a second input coupled to the second node, and an output, and a first conductor disposed to conduct a first current to set the first resistive element to a first resistive value and the second resistive element to a second resistive value different from the first resistive value.

17 Claims, 6 Drawing Sheets

NON-VOLATILE MEMORY CELL AND METHODS THEREOF

FIELD OF THE DISCLOSURE

The present disclosure relates to memories, and more particularly to non-volatile memory cells.

BACKGROUND

As semiconductor process technology shrinks in dimensions, the leakage current associated with applying power to CMOS circuits greatly increases. One factor limiting the ability of semiconductor integrated circuits to turn off power when not in use is the necessity to retain the state of latch elements in the integrated circuit. Because the latch elements are typically volatile storage, disabling power would cause the loss of the stored state of the latch elements, leading to a loss of critical data. However, in some devices this loss of critical data is undesirable. For example, for a portable, battery-powered, or other device that frequently enters a low-power mode, it is desirable to retain critical system data, so that the device can exit the low power mode without an extensive startup procedure.

Accordingly, there is a need for a non-volatile storage element usable in an integrated circuit that is able to retain the state of the storage element in the absence of power to the integrated circuit.

DETAILED DESCRIPTION

Figure 1:
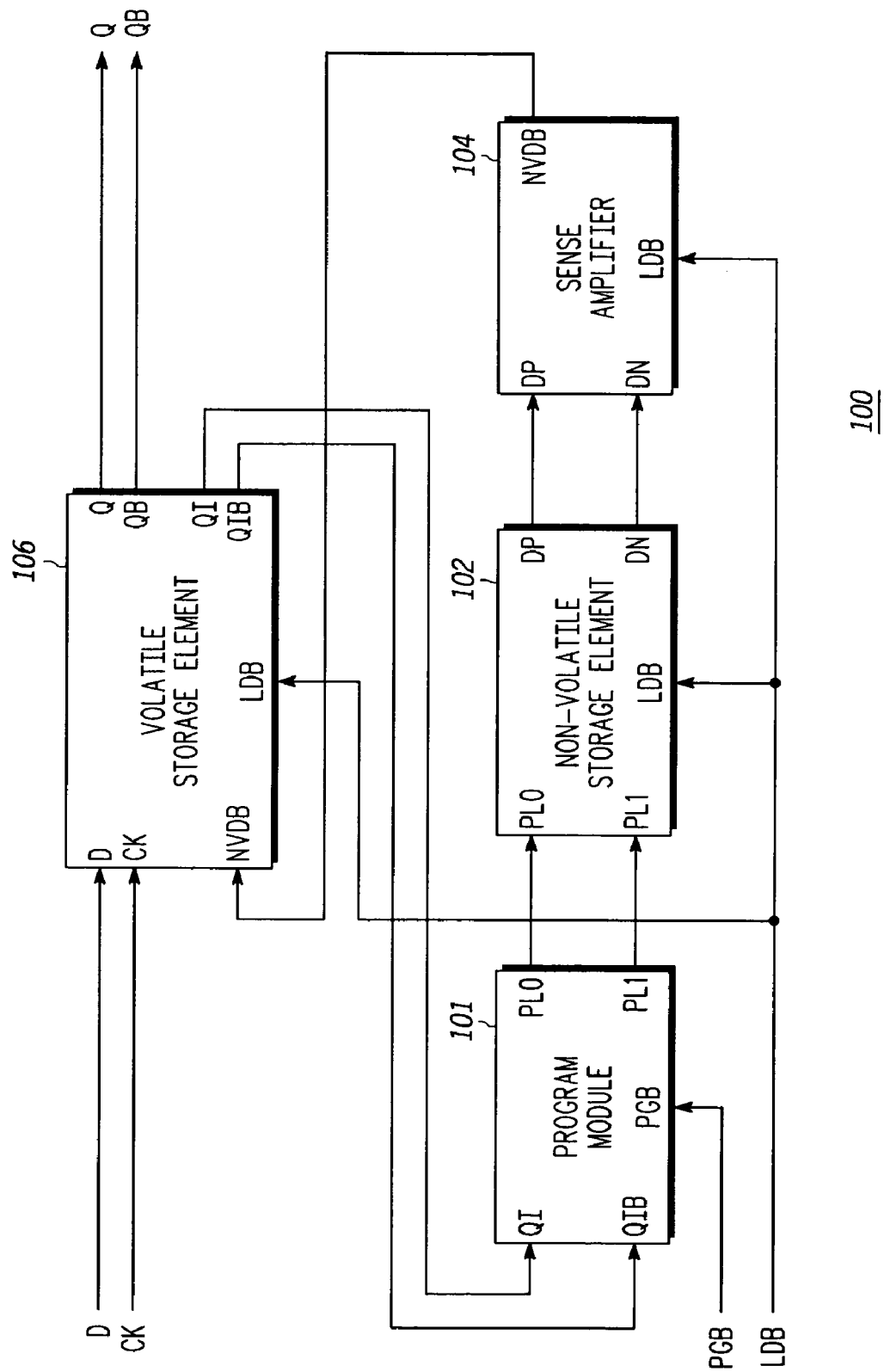
FIG. 1 is a block diagram of a particular embodiment of a system having a non-volatile storage element according to the present invention.

Referring to FIG. 1, a block diagram of a memory device 100 is illustrated. The device 100 includes a program module 101, a non-volatile storage element 102, a sense amplifier 104, and a volatile storage element 106. The volatile storage element 106 includes a clock input labeled CK, a data input labeled D, a control input labeled LDB, a data input labeled NVDB, two data outputs labeled QI and QIB, and two data outputs labeled Q and QB. The sense amplifier 104 includes a control input labeled LDB, two data signal inputs labeled DP and DN, and an output connected to the NVDB input of the volatile storage element 106. The program module 101 includes a control input labeled PGB, two data inputs connected to the outputs QI and QIB of the volatile storage element 106, and two control outputs to provide control signals PL0 and PL1. The non-volatile storage element 102 includes two inputs to receive the control signals PL0 and PL1 respectively, a control input LDB, and two outputs connected to the two inputs of the sense amplifier 104.

The volatile storage element 106 may be employed as a storage element disposed in an integrated circuit device. The volatile storage element 106 stores data in conjunction with other volatile storage elements that also store other information useful for the integrated circuit device. The volatile storage element 106 receives data via the input D, latches the data in response to control input CK, and provides the latched data via the outputs Q and QB.

The volatile storage element 106 cannot retain its state when the integrated circuit is powered down. Accordingly, in the event that power to the integrated circuit is reduced, such as when the integrated circuit transitions from an active state to a low power state or an off state, the program module 101 reads the state of the volatile storage element 106 and stores that state in the non-volatile storage element 102.

When the integrated circuit transitions from the low power or off state to an active state, the sense amplifier 104 senses the state of the non-volatile storage element 102 in response to the control signal LDB, and provides the sensed state to the input NVDB of the volatile storage element 106. The value provided at the input NVDB is latched at the volatile storage element 106 in response to the LDB input. Accordingly, data is stored at the non-volatile storage element 102 when the integrated circuit is powered down, and the data is restored to the volatile storage element 106 upon power up of the integrated circuit. This allows the integrated circuit to go into a power down state without losing critical data.

The non-volatile storage element 102 includes one or more resistive elements using a magnetic tunnel junction (MTJ) region. The program module 101 selectively applies current to the one or more MTJ elements via the control signals PL0 and PL1, in response to the PGB input. The application of current changes the resistive value of the resistive elements. By setting the resistive values of the resistive elements appropriately, the state of the non-volatile storage element 102 can be changed. Further, the MTJ elements will retain their resistive characteristics when the integrated circuit is powered down. Accordingly, the system 100 is able to retain the state of critical data by storing the data in the non-volatile storage element 102 in the absence of power to the integrated circuit. In addition, data can be written to the non-volatile storage element 102 more quickly than conventional non-volatile memory cells.

Figure 2:
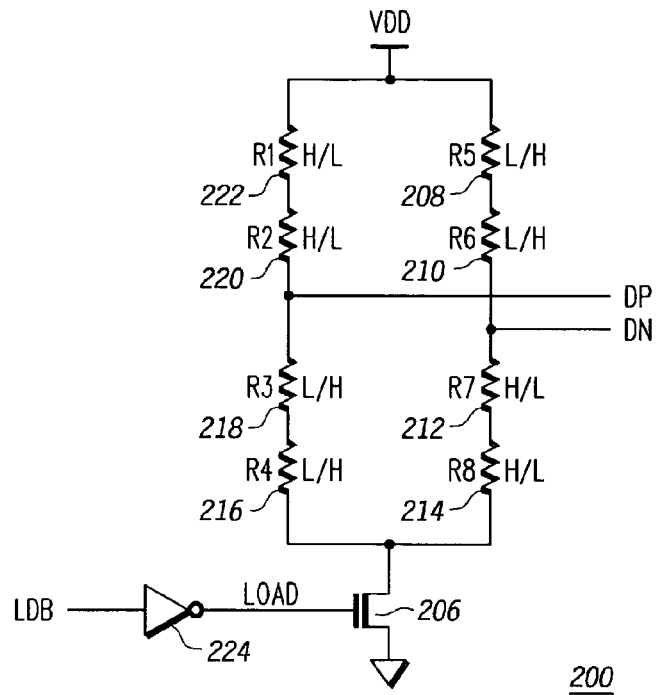
FIG. 2 is a partial logic and partial circuit diagram of the non-volatile storage element of FIG. 1.

Referring to FIG. 2, a partial logic and partial circuit diagram of a particular embodiment of a non-volatile storage element 102, which can correspond to the non-volatile storage element 102 of FIG. 1, is illustrated. The non-volatile storage element 200 includes two outputs and a control input LDB.

The non-volatile storage element 102 includes resistors 208, 210, 212, 214, 216, 218, 220 and 222. The non-volatile storage element 102 also includes a transistor 206 and an inverter 224. The resistor 208 includes a first electrode connected to a first power supply voltage labeled "VDD" and a second electrode. The resistor 210 includes a first electrode connected to a second electrode of the resistor 208, and a second electrode connected to the node DN of the non-volatile storage element 102. The resistor 212 includes a first electrode connected to the output DN and a second electrode. The resistor 214 includes a first electrode connected to the second electrode of the resistor 212 and a second electrode. The resistor 216 includes a first electrode connected to the second electrode of the resistor 214 and a second electrode. The resistor 218 includes a first electrode connected to the second electrode of the resistor 216 and a second electrode connected to the output DP of the non-volatile storage element 102. The resistor 220 includes a first electrode connected to the output DP of the non-volatile storage element 102, and a second electrode. The resistor 222 includes a first electrode connected to the second electrode of the resistor 220 and a second electrode connected to the power supply voltage VDD. The transistor 206 includes a first current electrode connected to the second electrode of the resistor 214, a second current electrode connected to a ground voltage, and a gate electrode. The inverter 224 has an input for receiving the LDB signal and an output connected to the gate electrode of transistor 206.

Each of the resistors 208, 210, 212, 214, 216, 218, 220 and 222 are incorporated using MTJ elements, each with two distinct resistance states, a high resistance state and a low resistance state. The resistance state of each of the respective MTJ elements represented by resistors 208-222 are based on the relative magnetic moment vector of the magnetic layers of the MTJ elements. The relative magnetic moment vector of the magnetic layers may be set by applying a field of sufficient magnitude and direction across each of the MTJ elements. The direction of the field applied to each MTJ element determines the resulting resistance state set to each MTJ element. Accordingly, control signals may be applied to set the respective resistances of each of the resistors 208-222.

During operation, a logic low applied to the LDB input is inverted by inverter 224 and a logic high level is applied to the gate electrode of transistor 206, providing a low resistance path to the ground voltage for the resistive ladders formed by resistors 208-222. The voltage VDD is divided across the resistor ladder formed by the resistors 222, 220, 218, and 216, resulting in a voltage at output DP, and also across the resistor ladder formed by the resistors 208, 210, 212, and 214, resulting in a voltage at output DN. Accordingly, by applying a logic low to the LDB input, a voltage difference results between outputs DP and DN representing the state of the non-volatile storage element.

For example, if the values of the resistors 208, 210, 216 and 218 are set to a low resistance value, while the resistive value of the resistors 212, 214, 222, and 220 are set to a high resistance value, the voltage at the DN output will be higher than the voltage sensed at the DP output. Similarly, if the resistances of the resistor ladders are reversed, the differences between the voltages of the DP and DN output will likewise be reversed. Accordingly the differences in the voltage at DP and DN are representative of the state of the non-volatile storage element 201.

Figure 3:
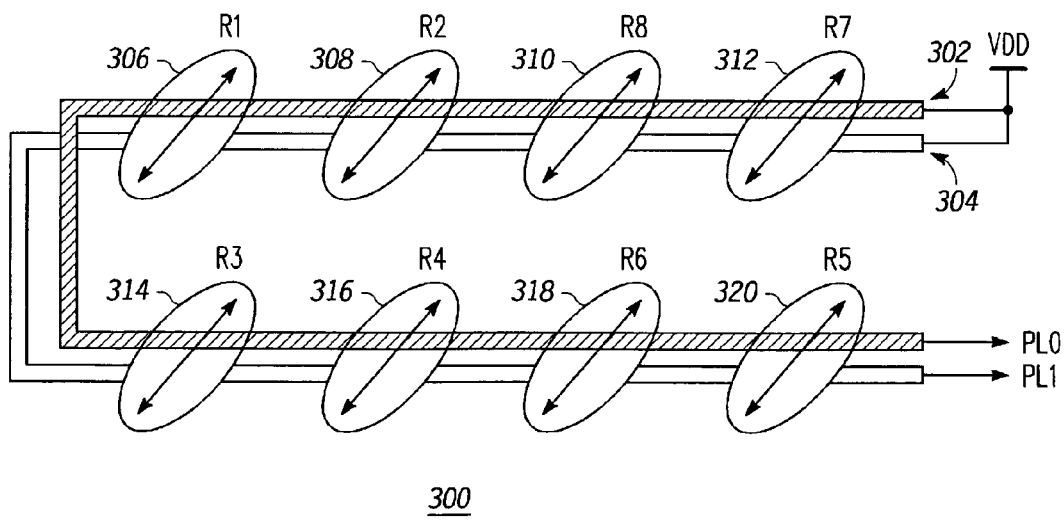
FIG. 3 is a top view diagram of the layout of the non-volatile storage element of FIG. 2.

Referring to FIG. 3, a layout of a non-volatile memory element 300 is illustrated, which corresponds to the non-volatile storage element 102 of FIGS. 1 and 2, as well as the non-volatile storage element 200 shown in the circuit diagram of FIG. 2. The non-volatile storage element 300 includes MTJ elements 306, 308, 310, 312, 314, 316, 318, and 320, which can correspond to resistors 222, 220, 214, 212, 218, 216, 210, and 208, respectively, of non-volatile storage element 200 of FIG. 2. The non-volatile storage element also includes a first current line 302, and a second current line 304. The current line 302 is disposed above the MTJ elements 306-320, while the current line 304 is disposed underneath the MTJ elements. The current lines 302 and 304 each have a first terminal coupled to the reference voltage VDD and a second current terminal coupled to control inputs PL0 and PL1 respectively.

The resistive state of each MTJ element is based on the relative magnetic moment vector of the magnetic layers within each of the MTJ elements 306-320. The magnetic moment vector of these magnetic layers within each MTJ element may be set by application of a field across the MTJ, the magnitude and direction of the field determining the resulting resistance state. The field may be generated by flowing current through one of the current lines 302 or 304 located in close proximity to each of the MTJ elements, the magnitude and direction of the resulting field being a function of the magnitude and direction of the current as well as the physical location of the current line with respect to the magnetic layers of the MTJ. For example, a current flowing from the reference voltage VDD, through the current line 302, to the control input PL0, flows right to left above each of the MTJ elements 312, 310, 308, 306, generating a field through each MTJ element in the down direction, while flowing left to right above each of the MTJ elements 314, 316, 318, and 320, generating a field through each MTJ element in the up direction, thereby setting the state of the MTJ elements 306-312 to a state opposite the state set to MTJ elements 314-320. Likewise, a current flowing from the reference voltage VDD, through the current line 304, to the control input PL1, flows right to left below each of the MTJ elements 312, 310, 308, 306, generating a field through each MTJ element in the up direction, while flowing left to right below each of the MTJ elements 314, 316, 318, and 320, generating a field through each MTJ element in the down direction, thereby setting the state of the MTJ elements 306-312 to a state opposite the state set to MTJ elements 314-320 and the states of all MTJ elements 306-320 opposite the states set when flowing current through program line 302. Accordingly, by placing the MTJ elements so that current flowing through program lines in close proximity and in an appropriate direction, the value of the resistive ladders such as the resistive ladders of FIG. 2 may be set to set a value of the non-volatile memory cell 300.

In particular, each of the MTJ elements 306-320 includes a magnetic layer with a particular relative magnetic moment vector. The resistive value of each of the MTJ elements 306-320 is dependent on the magnetic moment vector of the magnetic layers associated with each MTJ element. Further, the magnetic moment vector of the magnetic layers associated with each of the MTJ elements 306-320, and therefore the resistive value of each MTJ element, can be changed by applying a current through one of the current lines 302 or 304. In addition, as illustrated, each of the MTJ elements 306-320 are arranged at an approximately 45 degree angle with respect to the current lines 302 and 304. This arrangement facilitates the change of the relative magnetic moment vector in the magnetic layers of each of the MTJ elements 306-320 when current is applied.

Figure 4:
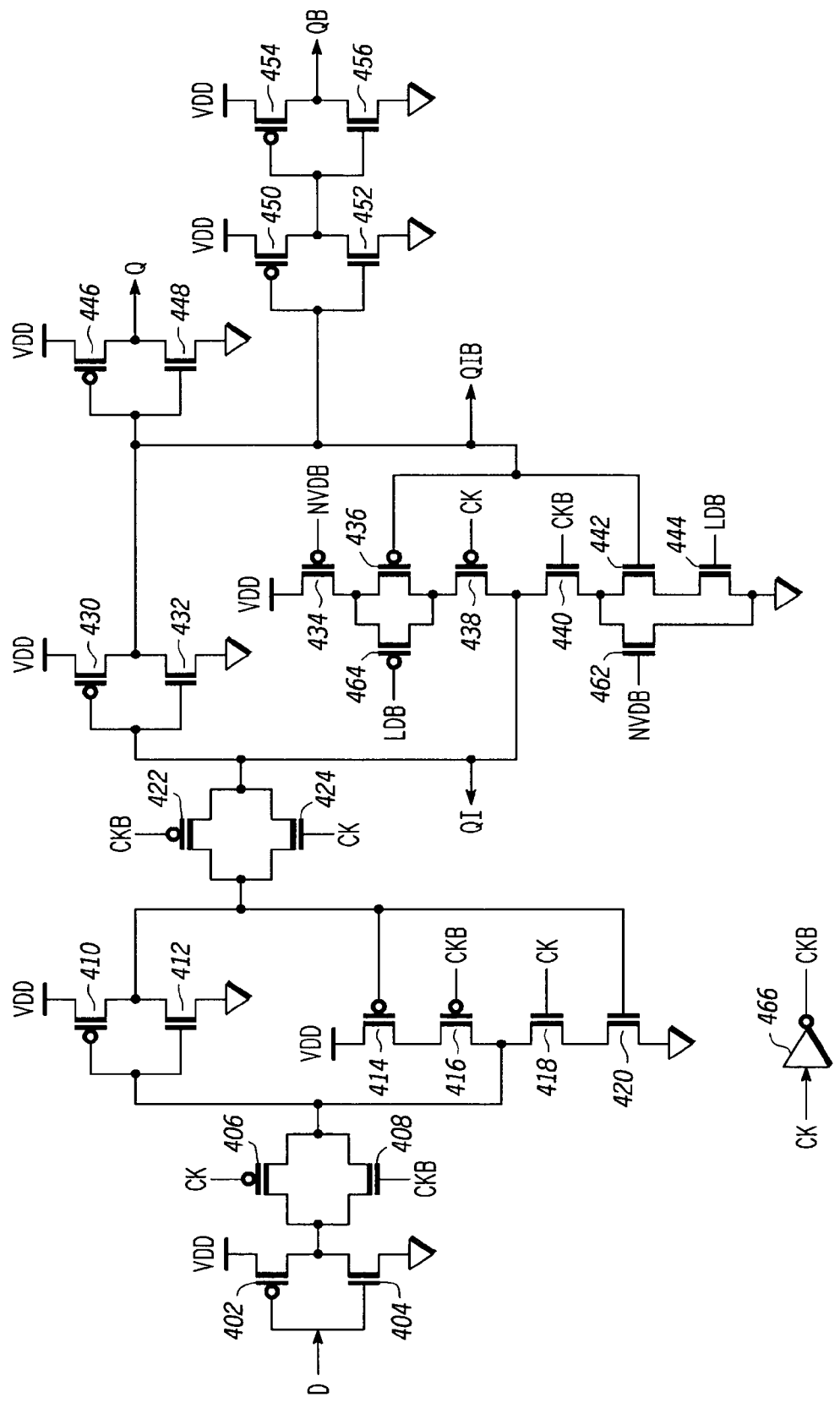
FIG. 4 is a circuit diagram of a volatile storage element that can be used in conjunction with the non-volatile storage element of FIG. 1.

Referring to FIG. 4, a volatile storage element 400 is illustrated, which can correspond to the volatile storage element 106 of FIG. 1. The volatile storage element 400 includes transistors 402, 404, 406, 408, 410, 412, 414, 416, 418, 420, 422, 424, 430, 432, 434, 436, 438, 440, 442, 444, 446, 448, 450, 452, 454, 456, 462, and 464, as well as inverter 466. The transistor 402 includes a current electrode connected to a reference voltage VDD, a second current electrode, and a gate electrode connected to an input labeled D. The transistor 404 includes a current electrode connected to the second current electrode of the transistor 402, a second current electrode connected to a ground reference voltage, and a gate electrode connected to the input D. The transistor 406 includes a first current electrode connected to the second current electrode of the transistor 402, a second current electrode, and a gate electrode to receive the clock signal labeled CK. The transistor 408 includes a first current electrode connected to the second current electrode of the transistor 402, a second current electrode connected to the second current electrode of the transistor 406, and a gate electrode to receive the clock signal labeled CKB.

The transistor 410 includes a current electrode connected to the reference voltage VDD, a second current electrode, and a gate electrode connected to the second current electrode of the transistor 406. The transistor 412 includes a first current electrode connected to the second current electrode of the transistor 410, a second current electrode connected to a ground reference voltage, and a gate electrode connected to the second current electrode of the transistor 406. The transistor 414 includes a first current electrode connected to the reference voltage VDD, a second current electrode, and a gate electrode connected to the second current electrode of the transistor 410. The transistor 416 includes a first current electrode connected to the second current electrode of the transistor 414, a second current electrode connected to the second current electrode of the transistor 406, and a gate electrode to receive the clock signal CKB.

The transistor 418 includes a first current electrode connected to the second current electrode of the transistor 406, a second current electrode, and a gate electrode to receive the clock signal CK. The transistor 420 includes a first current electrode connected to the second current electrode of the transistor 418, a second current electrode connected to the ground reference voltage, and a gate electrode connected to the second current electrode of the transistor 410. The transistor 422 includes a first current electrode connected to the second current electrode of the transistor 410, a second current electrode connected to the data output QI, and a gate electrode to receive the clock signal CKB.

The transistor 424 includes a first current electrode connected to the second current electrode of the transistor 410, a second current electrode connected to data output QI, and a gate electrode to receive the clock signal CK. The transistor 430 includes a first current electrode connected to the reference voltage VDD, a second current electrode connected to the data output QIB, and a gate electrode connected to the second current electrode of the transistor 422. The transistor 432 includes a first current electrode connected to the second current electrode of the transistor 430, a second current electrode connected to a ground reference voltage, and a gate electrode connected to the data output QI.

The transistor 434 includes a first current electrode connected to the reference voltage VDD, a second current electrode, and a gate electrode to receive the signal NVDB. The transistor 436 includes a first current electrode to the second current electrode of the transistor 434, a second current electrode and a gate electrode connected to the data output QIB. The transistor 438 includes a first current electrode connected to the second current electrode of the transistor 436, a second current electrode connected to the data output QI, and a control signal to receive the clock signal CK. The transistor 440 includes a current electrode connected to the data output QI, a second current electrode, and a control gate electrode to receive the clock signal CKB.

The transistor 442 includes a first current electrode connected to the second current electrode of the transistor 440, a second current electrode and a gate electrode connected to the data output QIB. The transistor 444 includes a first current electrode connected to the second current electrode of the transistor 442, a second current electrode connected to the ground reference voltage, and a gate electrode to receive the control signal LDB. The transistor 446 includes a first current electrode connected to the reference voltage VDD, a second current electrode to provide the data output Q, and a gate electrode connected to the data output QIB. The transistor 448 includes a first current electrode connected to the data output Q, a second current electrode connected to the ground reference voltage, and a gate electrode connected to the data output QIB.

The transistor 450 includes a first current electrode connected to the reference voltage VDD, a second current electrode, and a gate electrode connected to data output QIB. The transistor 452 includes a first current electrode connected to the second current electrode of the transistor 450 a second current electrode connected to the ground reference voltage, and a gate electrode connected to the data output QIB. The transistor 454 includes a first current electrode connected to the reference voltage VDD, a second current electrode connected to the data output QB, and a gate electrode connected to the second current electrode of the transistor 450. The transistor 456 includes a first current electrode connected to the data output QB, a second current electrode connected to a ground reference voltage, and a gate electrode connected to the second current electrode of the transistor 450.

The transistor 462 includes a first current electrode connected to the second current electrode of the transistor 440, a second current electrode connected to the ground reference voltage, and a gate electrode to receive the signal NVDB. The transistor 464 includes a first current electrode connected to the second current electrode of the transistor 434, a second current electrode connected to the second current electrode of the transistor 436, and a gate electrode to receive the signal LDB.

The transistors 402, 404, 406, 408, 410, 412, 414, 416, 418, and 420 are arranged as a master portion of a master-slave latch while the transistors 422, 424, 430, 432, 436, 438, 440, 442, 446, and 448 are arranged as the slave portion, provided transistors 434 and 444 are on, or conductive, and transistors 462 and 464 are off, or non-conductive. During operation, the master portion of the latch receives the data present at the input D while the CK input is a logic low. Data from the master portion is transferred to the slave portion after the CK input transitions from a low to a high logic state. When the CK input returns to a logic low state to receive new data into the master portion, data transferred from the previous low to high transition is latched in the slave. The data in the slave portion is provided at the output Q. Similarly, the arrangement of the transistors 450, 452, 454, and 456 provide an inverted representation of the latched value at the output QB. The data in the slave portion and its inverted representation are also provided on data output QI and QIB, respectively.

The arrangement of the transistors 434, 444, 464, and 462 form a load module which allows data to be loaded into the slave stage of the volatile storage element 400, such as the data representing the state of the non-volatile storage element 102 of FIG. 1. In particular, the state of the non-volatile latch element is provided at the input NVDB and is loaded into the slave stage of the volatile latch element 400 while control signal LDB is a logic low and clock input CK is a logic low, then latched after signal LDB returns to a logic high. The signal NVDB may be provided by a sense amplifier, such as the sense amplifier 104 of FIG. 1, that senses the state of the non-volatile latch element.

Figure 5:
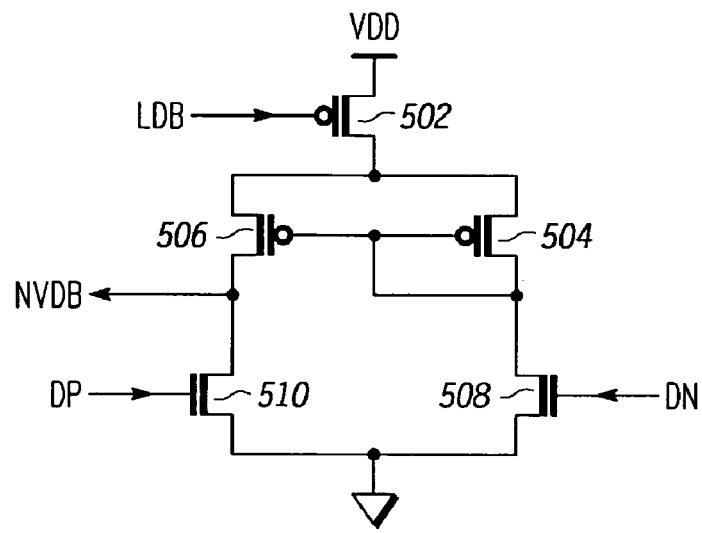
FIG. 5 is a circuit diagram of a sense amplifier that can be used in conjunction with the non-volatile storage element of FIG. 1.

Referring to FIG. 5, a circuit diagram of the sense amplifier 104 of FIG. 1 is illustrated. The sense amplifier 104 includes transistors 502, 504, 506, 508, and 510. The transistor 502 has a first current electrode connected to the reference voltage VDD, a gate electrode for receiving the input LDB, and a second current electrode. The transistor 504 has a first current electrode connected to the second current electrode of the transistor 502, a gate electrode, and second current electrode connected to the gate electrode. The transistor 506 has a first current electrode connected to the second current electrode of the transistor 502, a gate electrode connected to the gate electrode of the transistor 504, and a second current electrode connected to the output NVDB. The transistor 508 has a first current electrode connected to the gate electrode of the transistor 504, a gate electrode for receiving the input DN, and a second current electrode connected to the ground reference. The transistor 510 has a first current electrode connected to the output NVDB, a gate electrode for receiving the input DP, and a second current electrode connected to the ground reference.

In operation, the sense amplifier 104 acts as a differential amplifier with sufficient gain to amplify the voltage difference between inputs DN and DP to provide a logic signal on output NVDB. In particular, the current flowing through the transistors 508 and 504 that is a function of the voltage at input DN. The current flowing through the transistor 504 biases the gate electrode of the transistor 504 in a manner that mirrors the current bias condition onto the gate electrode of the transistor 506, resulting in a bias on the transistor 506 sufficient to pull up with an equal magnitude to the current flowing through the transistor 504. The voltage at input DP similarly biases the transistor 510 sufficiently to flow a current of a magnitude that is a function of the input voltage DP, where the function of the voltage at input DP is substantially the same as the function of the voltage at input DN. The voltage at output NVDB responds to the difference in the bias conditions for the transistors 506 and 510, where a higher current bias condition on the transistor 506 than on the transistor 510, resulting from a higher voltage on the input DN than the voltage on the input DP, results in a logic high on output NVDB. Conversely, a lower current bias condition on the transistor 506 than the transistor 510, resulting from a lower voltage on the input DN than the voltage on the input DP, results in a logic low on output NVDB.

Figure 6:
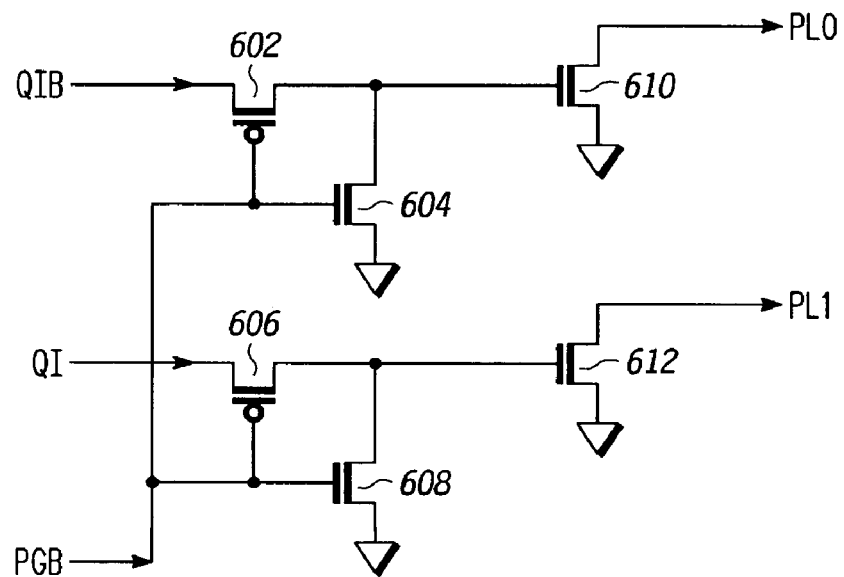
FIG. 6 is a circuit diagram of a program module that can be used in conjunction with the non-volatile storage element of FIG. 1.

Referring to FIG. 6, a circuit diagram of the program module 101 of FIG. 1 is illustrated. The program module 101 includes transistors 602, 604, 606, 608, 610, and 612. The transistor 602 has a first current electrode for receiving signal QIB, a gate electrode for receiving signal PGB, and a second current electrode. The transistor 604 has a first current electrode connected to the second current electrode of the transistor 602, a gate electrode for receiving signal PGB, and a second current electrode connected to the ground reference. The transistor 606 has a first current electrode for receiving input QI, a gate electrode for receiving signal PGB, and a second current electrode. The transistor 608 has a first current electrode connected to the second current electrode of the transistor 606, a gate electrode connected to the input PGB, and a second current electrode connected to the ground reference. The transistor 610 has a first current electrode for receiving signal PL0, a gate electrode connected to the second current electrode of the transistor 602, and a second current electrode connected to the ground reference. The transistor 612 has a first current electrode for receiving signal PL1, a gate electrode connected to the second current electrode of the transistor 606, and a second current electrode connected to the ground reference.

In operation, the program module 101 provides a current path to the ground reference on either output PL0 or output PL1 while signal PGB is a logic low, in response to the signals QIB and QI respectively. While signal PGB is a logic high, the transistors 602 and 604 are off, or non-conductive, and the transistors 604 and 608 are both on, or conductive, resulting in a logic low voltage applied to the gate terminals of the transistors 610 and 612. As a result, a logic high on the signal PGB causes the transistors 610 and 612 to both be off, or non-conductive, and there is no current draw on the outputs PL0 and PL1. When a logic low is applied as signal PGB, the transistor 602 is on, or conductive, while the transistor 604 is off, or non-conductive, causing the logic state of signal QIB to be applied to the gate electrode of the transistor 610. In a similar manner, the logic state of the signal QI is applied to the gate electrode of the transistor 612. If a logic high is passed as the signal QIB onto the gate electrode of the transistor 610, a conductive path to the ground reference will be enabled at the output PL0, allowing current to flow from the output PL0 to the ground reference. Likewise, if a logic high is passed as the signal QI onto the gate electrode of the transistor 612, a conductive path to the ground reference will be enabled as the signal PL1. In this way, the program module 101 enables current flow to the ground reference from either the PL0 or PL1 output in response to the QIB and QI inputs respectively.

Figure 7:
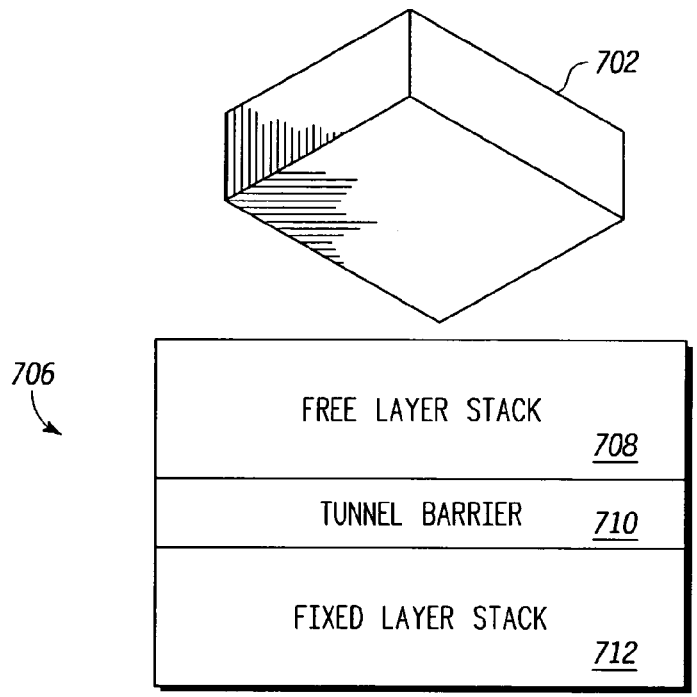
FIG. 7 is a cross section of one of the resistive elements of FIG. 2.

Referring to FIG. 7, a cross section of a resistive element 700 comprising an MTJ element is illustrated. The resistive element 700 includes a first current line 702, a second current line 704, and an MTJ element 706. The first current line 702, the second current line 704, and the MTJ element 706 could represent current line 302, current line 304, and MTJ element 312, respectively from FIG. 3. The MTJ element 706 includes a free layer stack 708, a tunnel barrier 710, and a fixed layer stack 712.

During operation, the magnetic moment vector of the fixed layer stack 712 is pinned to a known direction and typically cannot be changed under the field expected during normal operation of the resistive element 700. The magnetic moment vector of the free layer stack 708 can be switched between two stable states when sufficient magnetic field is applied to the layer. The current lines 702 and 704 can each carry current to generate the field necessary to switch the state of the free layer stack 708.

Figure 8:
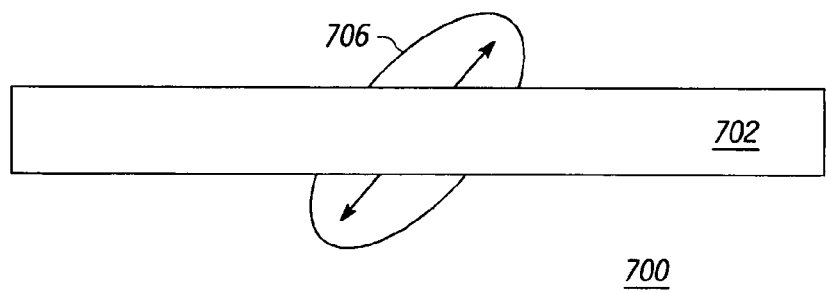
FIG. 8 is a top view of the resistive element of FIG. 7.

Referring to FIG. 8, a top down view of the resistive element 700 is illustrated. As illustrated therein, the MTJ element 706 is at an approximate 45-degree orientation relative to the current line 702. The MTJ element 706 is also oriented in an approximately 45 degree offset orientation relative to the current line 704 (not shown). By offsetting the MTJ element orientation relative to the current line orientation, a single current flowing through the current line in one direction can set the state of the MTJ element with the lowest magnitude of required current, where other angles between the MTJ element orientation and the current line would require more current to set the MTJ element to the desired state or have a lower probability of setting the MTJ element to the desired state for a given current magnitude.

Figure 9:
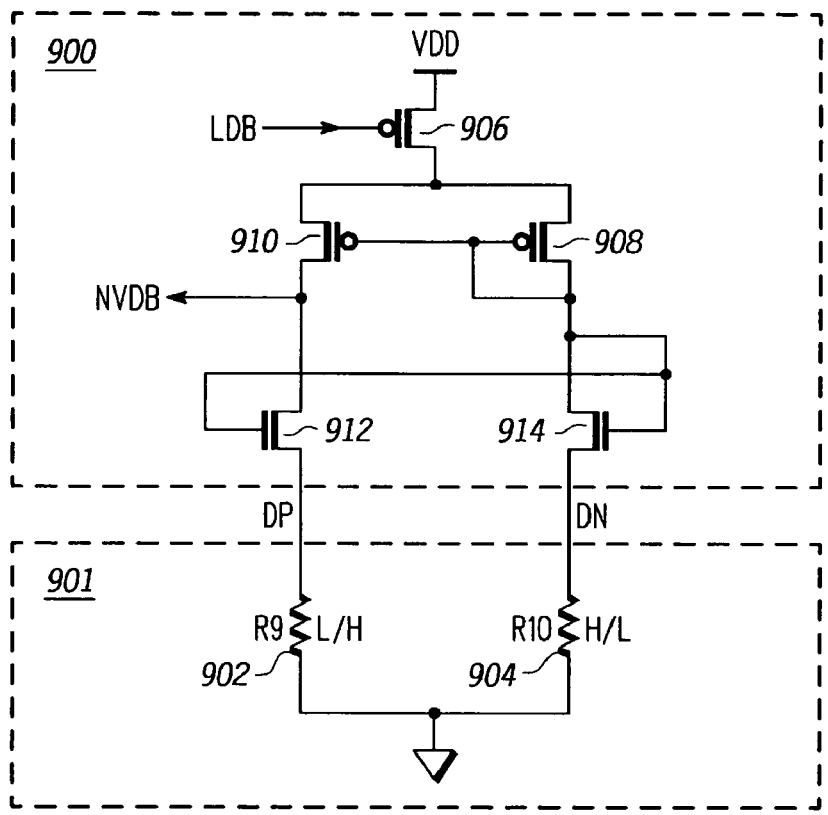
FIG. 9 is a circuit diagram of a circuit having a non-volatile storage element and an integrated sense amplifier according to an alternate embodiment of the present invention.

Referring to FIG. 9, circuit diagram of an alternative embodiment of a sense amplifier 900 and an alternate embodiment of non-volatile storage element 901, which can be used together in place of sense amplifier 104 and non-volatile storage element 102 of FIG. 1, respectively, is illustrated. The sense amplifier 900 includes transistors 906, 908, 910, 912, and 914. The non-volatile storage element 901 includes resistors 902 and 904. The resistor 902 includes a first electrode connected to a ground reference voltage and a second electrode to provide an output signal DP. The second resistor 904 includes a first electrode connected to the ground reference voltage and a second electrode to provide an output labeled DN. The transistor 906 includes a current electrode connected to a reference voltage VDD, a second current electrode, and a gate electrode to receive a control signal LDB.

The transistor 908 includes a first current electrode connected to a second current electrode of the transistor 906, a second current electrode, and a gate electrode connected to the second current electrode of the transistor 908. The transistor 910 includes a first current electrode connected to the second current electrode of the transistor 906, a second current electrode for providing the signal NVDB, and a gate electrode connected to the gate electrode of the transistor 908. The transistor 912 includes a first current electrode connected to the signal NVDB, a second current electrode connected to the first electrode of the resistor 902, and a gate electrode connected to the second current electrode of the transistor 908. The transistor 914 includes a first current electrode connected to the second current electrode of the transistor 908, a second current electrode connected to the first electrode of the resistor 904, and a gate electrode connected to the second current electrode of the transistor 908.

During operation, the state of a volatile latch element may be stored in the non-volatile storage element 901 by setting the resistances of the resistors 902 and 904 in a similar fashion as described above with respect to FIG. 3. In particular, each of the resistors 902 and 904 includes an MTJ element with a resistive value that can be changed by altering the relative magnetic layer orientation of those MTJ elements. The arrangement of the transistors 910, 908, 912, and 914 apply a similar voltage across resistor 902 and resistor 904 in response to a logic low input on the LDB signal, then, sense the difference in current values at the outputs DP and DN of the resistors 902 and 904, and based on the sensed current difference provide a value at the output NVDB. The output NVDB is used to set the state of a volatile storage element, as described with respect to FIG. 4.

Figure 10:
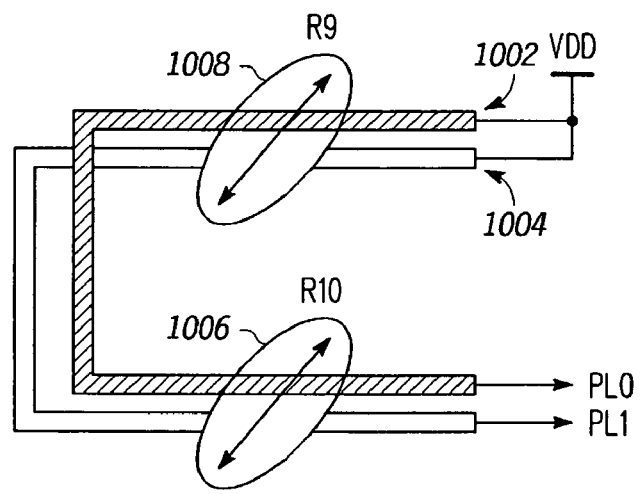
FIG. 10 is a top view diagram of a layout of the non-volatile storage element of FIG. 9.

Referring to FIG. 10, a layout of a non-volatile memory element 1000 is illustrated, which can correspond to the non-volatile storage element 102 of FIG. 1, as well as the non-volatile storage element 901 shown in the circuit diagram of FIG. 9. The non-volatile storage element 1000 includes MTJ elements 1006 and 1008, which can correspond to MTJ elements 904 and 902 in FIG. 9, respectively. The non-volatile storage element 1000 also includes a first current line 1002 and a second current line 1004. The current line 1002 is disposed above the MTJ elements 1006 and 1008, while the current line 1004 is disposed underneath the MTJ elements 1006 and 1006. The current lines 1002 and 1004 each have a first terminal coupled to the reference voltage VDD and a second terminal coupled to control inputs PL0 and PL1 respectively.

The resistive state of the MTJ elements can be set in a manner similar to that described for non-volatile storage element 300. Current flowing from the reference voltage VDD through the first current line 1002 to the control input PL0 will generate a field in the down direction across the MTJ element 1008 and a field in the up direction across MTJ element 1006, thereby setting the MTJ elements 1006 and 1008 to opposite resistance states. Similarly, current flowing from the reference voltage VDD through the current line 1004 to the control terminal PL1 will generate a field in the up direction across MTJ element 1008 and a field in the down direction across MTJ element 1006, thereby setting the MTJ elements 1006 and 1008 to resistance states opposite each other and opposite the states set by flowing current through current line 1002.

A memory device has been disclosed. In a particular embodiment, the memory device includes a first resistive element having a first magnetic tunnel junction (MTJ) element, a first node coupled to the first resistive element, a second resistive element having a second MTJ element, a second node coupled to the second resistive element, a sense amplifier having a first input coupled to the first node, a second input coupled to the second node, and an output, and a first conductor disposed to conduct a first current to set the first resistive element to a first resistive value and the second resistive element to a second resistive value different from the first resistive value.

In a particular aspect, the sense amplifier provides the output responsive to a difference in voltage between the first node and the second node. In another particular aspect, the first MTJ element includes a magnetic region having a magnetic moment vector relative to the first conductor that is substantially different than a magnetic moment vector of the second MTJ.

In a particular aspect, the memory device includes a second conductor disposed to conduct a second current to set the first resistive element to a third resistive value and to set the second resistive element to a fourth resistive value different from the third resistive value. In another particular aspect, the sense amplifier provides the output thereof responsive to a difference between a second current flowing into the first node and a third current the second node.

In a particular aspect, the sense amplifier includes a first transistor having a first current electrode coupled to a first reference terminal, a second current electrode, and a control electrode coupled to the second current electrode, a second transistor having a first current electrode coupled to the second current electrode of the first transistor, a second current electrode coupled to the second node, and a control electrode coupled to the second current electrode of the first transistor, a third transistor having a first current electrode coupled to the first reference voltage terminal, a second current electrode coupled to the output of the sense amplifier, and a control electrode coupled to the second current electrode of the first transistor, and a fourth transistor having a first current electrode coupled to the second current electrode of the third transistor, a second current electrode coupled to the first node, and a control electrode coupled to the second current electrode of the first transistor.

In a particular aspect, the memory device includes a volatile storage element having an input coupled to the signal output of the sense amplifier, and an output for providing a second output signal. In another particular aspect, the memory device includes a program module having a first input to receive a control signal, a second input coupled to the data output of the volatile storage element, and an output coupled to the first conductor. In a particular aspect, the program module selectively provides the first current to the first conductor in response to the data output of the volatile storage element. In another particular aspect, the program module includes a first transistor having a first current electrode coupled to the second input of the program module, a second current electrode, and a control electrode coupled to the first input of the program module, a second transistor having a first current electrode coupled to the second current electrode of the first transistor, a second current electrode coupled to a first power supply voltage terminal, and a control electrode coupled to the first input of the program module, and a third transistor having a first current electrode coupled to the output of the program module, a second current electrode coupled to the first power supply voltage terminal, and a control electrode coupled to the second current electrode of the first transistor.

A storage device has been disclosed. In a particular embodiment, the storage device includes a first resistive ladder having a first plurality of magnetic tunnel junction (MTJ) elements, a first node coupled to the first resistive ladder, a second resistive ladder having a second plurality of MTJ elements, a second node coupled to the second resistive ladder, and a sense amplifier having a first input coupled to the first node (DP), a second input coupled to the second node, and an output.

In a particular aspect, the first resistive ladder includes a first reference voltage node, a second reference voltage node, a first MTJ element having a first current electrode coupled to the first reference voltage node of the first MTJ element and a second current electrode coupled to the first node, and a second MTJ element having a first current electrode coupled to the first node and a second current electrode coupled to the second reference voltage node.

In another particular aspect, the first resistive ladder further includes a third MTJ element having a first current electrode coupled to the first reference voltage node and a second current electrode coupled to the first current electrode of the first MTJ element, and a fourth MTJ element having a first current electrode coupled to the second current electrode of the second MTJ element and a second current electrode coupled to the second reference voltage node.

In still another particular aspect, the second resistive ladder includes a fifth MTJ element having a first current electrode coupled to the first reference voltage node and a second current electrode, a sixth MTJ element having a first current electrode coupled to the second current electrode of the fifth MTJ element and a second current electrode coupled to the second node, a seventh MTJ element having a first current electrode coupled to the second node and a second current electrode, and an eighth MTJ element having a first current electrode coupled to the second current electrode of the seventh MTJ element and a second current electrode coupled to the second reference voltage node.

In a particular aspect, the sense amplifier provides the output responsive to a difference in voltage between the first node and the second node. In another particular aspect, storage device includes a volatile storage element coupled to the sense amplifier.

A method of reading a non-volatile memory device has been disclosed. In a particular embodiment, the method includes setting a resistive value of a plurality of magnetic tunnel junction (MTJ) elements based on a current received at a conductor of the plurality of MTJ elements, and reading a state of a non-volatile memory cell, wherein the state of the non-volatile memory cell is based on the resistive value of the plurality of MTJ elements.

In a particular aspect, the method further includes sensing a first voltage value at a node of a first of the plurality of MTJ elements, sensing a second voltage value at a node of a second of the plurality of MTJ elements, and reading the state of the non-volatile memory cell by determining a state of a data signal based on a difference between the first voltage value and the second voltage value.

In another particular aspect, the method includes transitioning from an active power state to a low power state, and the current is received in response to the transition from the active state to the low power state. In still another particular aspect, the method includes setting the state of a volatile storage element based on the state of the non-volatile memory cell. In still another particular aspect, the method includes transitioning from a low power state to an active state and setting the state of the volatile storage element in response to transitioning from the low power state to the active state.

The above-disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A circuit with non-volatile storage, comprising:
   a first resistive element comprised of a first magnetic tunnel junction (MTJ) element;
   a first node coupled to the first resistive element;
   a second resistive element comprised of a second MTJ element;
   a second node coupled to the second resistive element;
   a sense amplifier having a first input coupled to the first node, a second input coupled to the second node, and an output;
   a first conductor disposed to conduct a first current to set the first MTJ element to a first resistive value and the second MTJ element to a second resistive value different from the first resistive value; and
   a second conductor disposed to conduct a second current to set the first MTJ element to a third resistive value and to set the second MTJ element to a fourth resistive value different from the third resistive value.

2. The circuit of claim 1, wherein the sense amplifier provides the output responsive to a difference in voltage between the first node and the second node.

3. The circuit of claim 1, wherein the first MTJ element comprises a magnetic region having a magnetic moment vector relative to the first conductor that is substantially different than a magnetic moment vector of the second MTJ.

4. The circuit of claim 1, wherein the sense amplifier provides the output thereof responsive to a difference between a second current flowing into the first node and a third current into the second node.

5. The circuit of claim 4, wherein the sense amplifier further comprises:
   a first transistor having a first current electrode coupled to a first reference voltage terminal, a second current electrode, and a control electrode coupled to the second current electrode; and
   a second transistor having a first current electrode coupled to the second current electrode of the first transistor, a second current electrode coupled to the second node, and a control electrode coupled to the second current electrode of the first transistor; and
   a third transistor having a first current electrode coupled to the first reference voltage terminal, a second current electrode coupled to the output of the sense amplifier, and a control electrode coupled to the second current electrode of the first transistor; and
   a fourth transistor having a first current electrode coupled to the second current electrode of the third transistor, a second current electrode coupled to the first node, and a control electrode coupled to the second current electrode of the first transistor.

6. The circuit of claim 1, further comprising a volatile storage element having an input coupled to the output of the sense amplifier, and an output for providing a second output signal.

7. The circuit of claim 6, further comprising:
   a program module comprising a first input to receive a control signal, a second input coupled to the data output of the volatile storage element, and an output coupled to the first conductor, wherein the program module selectively provides the first current to the first conductor in response to the data output of the volatile storage element.

8. The circuit of claim 7, wherein the program comprises:
a first transistor having a first current electrode coupled to the second input of the program module, a second current electrode, and a control electrode coupled to the first input of the program module;
a second transistor having a first current electrode coupled to the second current electrode of the first transistor, a second current electrode coupled to a first power supply voltage terminal, and a control electrode coupled to the first input of the program module; and
a third transistor having a first current electrode coupled to the output of the program module, a second current electrode coupled to the first power supply voltage terminal, and a control electrode coupled to the second current electrode of the first transistor.

9. A storage device, comprising,
a first resistive ladder comprised of a first plurality of magnetic tunnel junction (MTJ) elements;
a first node coupled to the first resistive ladder;
a second resistive ladder comprised of a second plurality of MTJ elements;
a second node coupled to the second resistive ladder;
a sense amplifier having a first input coupled to the first node, a second input coupled to the second node, and an output;
a first reference voltage node; and
a second reference voltage node;
wherein the first resistive ladder comprises a first MTJ element coupled between the first reference voltage node and the first node, and a second MTJ element coupled between the first node and the second reference voltage node; and
wherein the first resistive ladder further comprises a third MTJ element coupled between the first reference voltage node and the first node, and a fourth MTJ element coupled between the first node and the second reference voltage node.

10. The storage device of claim 9, wherein the second resistive ladder comprises a fifth MTJ element coupled between the first reference voltage node and the second node, a sixth MTJ element coupled between the first reference voltage node and the second node, a seventh MTJ element coupled between the second node the second reference voltage node, and an eighth MTJ element coupled between the second node and the second reference voltage node.

11. The storage device of claim 9, wherein the sense amplifier provides the output responsive to a difference in voltage between the first node and the second node.

12. The storage device of claim 9, further comprising:
a volatile storage element coupled to the sense amplifier.

13. A method, comprising:
setting a resistive value of a first resistor ladder comprising a first plurality of magnetic tunnel junction (MTJ) elements and a second resistive ladder comprising a second plurality of MTJ elements based on a current through a conductor of the first plurality of MTJ elements and the second plurality of MTJ elements; and
reading a state of a non-volatile memory cell, wherein the state of the non-volatile memory cell is based on resistive values of the plurality of MTJ elements.

14. The method of claim 13, further comprising:
sensing a first voltage value at a node coupled to a first one of the first plurality of MTJ elements;
sensing a second voltage value at a node of coupled to a second one of the second plurality of MTJ elements; and
reading the state of the non-volatile memory cell by determining a state of a data signal based on a difference between the first voltage value and the second voltage value.

15. The method of claim 13, further comprising:
transitioning from an active power state to a low power state; and
selectively providing the current in response to the transitioning from the active power state to the low power state.

16. The method of claim 13, further comprising:
setting the state of a volatile storage element based on the state of the non-volatile memory cell.

17. The method of claim 16, further comprising:
transitioning from the low power state to the active state; and
setting the state of the volatile storage element in response to transitioning from the low power state to the active state.

* * * * *